United States Patent
Hisada et al.

(10) Patent No.: US 7,045,879 B2
(45) Date of Patent: May 16, 2006

(54) SILICON CARBIDE SEMICONDUCTOR DEVICE HAVING ENHANCED CARRIER MOBILITY

(75) Inventors: Yoshiyuki Hisada, Okazaki (JP); Eiichi Okuno, Mizuho (JP); Yoshihito Mitsuoka, Nishikamo-gun (JP); Shinji Amano, Okazaki (JP); Takeshi Endo, Obu (JP); Shinichi Mukainakano, Nagoya (JP); Ayahiko Ichimiya, Nagoya (JP)

(73) Assignee: Denso Corporation, Kariya (JP)

( * ) Notice: Subject to any disclaimer, the term of this patent is extended or adjusted under 35 U.S.C. 154(b) by 30 days.

(21) Appl. No.: 10/744,071

(22) Filed: Dec. 24, 2003

(65) Prior Publication Data

US 2004/0159841 A1    Aug. 19, 2004

(30) Foreign Application Priority Data

Dec. 25, 2002    (JP)    ............... 2002-375266

(51) Int. Cl.
*H01L 31/0312*    (2006.01)
*H01L 31/036*    (2006.01)

(52) U.S. Cl. ............... 257/628; 257/77; 257/289
(58) Field of Classification Search ............ 257/77, 257/628, 289
See application file for complete search history.

(56) References Cited

U.S. PATENT DOCUMENTS

| 6,097,039 A * | 8/2000 | Peters et al. ............... 257/77 |
| 6,384,428 B1 * | 5/2002 | Oono et al. ............... 257/77 |
| 2001/0038108 A1 * | 11/2001 | Kitabatake et al. ......... 257/289 |

FOREIGN PATENT DOCUMENTS

JP    A-2000-294777    10/2000

* cited by examiner

*Primary Examiner*—Jerome Jackson
(74) *Attorney, Agent, or Firm*—Posz Law Group, PLC

(57) ABSTRACT

The principal surface of a p-type SiC substrate (1) is formed of a face intersecting (0001) Si-face at 10 to 16°. An $n^+$ source region (2) and an $n^+$ drain region (3) are formed in a surface layer portion at the principal surface of the p-type SiC substrate (1) so as to be separated from each other. A gate electrode (5) is formed on a gate oxide film (4) on the principal surface of the p-type SiC substrate (1).

12 Claims, 13 Drawing Sheets

SILICON CARBIDE SEMICONDUCTOR DEVICE HAVING ENHANCED CARRIER MOBILITY

CROSS REFERENCE TO RELATED APPLICATION

This application is based upon, claims the benefit of priority of, and incorporates by reference the contents of Japanese Patent Application No. 2002-375266 filed on Dec. 25, 2002.

FIELD OF THE INVENTION

The present invention relates to a silicon carbide semiconductor device using silicon carbide semiconductor material.

BACKGROUND OF THE INVENTION

Field effect transistors, such as a MOSFET disclosed in JP-A-2000-294777, have a channel formed on the surface of a SiC substrate. JP-A-2000-294777 discloses an approach for providing these devices with high carrier mobility and excellent device characteristics. According to this approach, a flat portion between bunching steps occurring in a high-temperature annealing process for the substrate is used as a channel portion for the field effect transistor. Also, it is designed to have a channel direction in which the moving direction of carriers in the channel does not cross the bunching steps.

However, JP-A-2000-294777 fails to disclose an approach for achieving practical applications with respect to the interface between the SiC substrate and a gate insulating film.

SUMMARY OF THE INVENTION

Accordingly, it is an object of the present invention to provide a silicon carbide semiconductor device having excellent practicability with respect to the interface between SiC and gate insulating film.

A silicon carbide semiconductor device is formed in an SiC substrate having as a primary surface a face intersecting to at least (0001) Si-face at an angle of 10 to 16°, wherein the primary surface is a channel face of a field effect MOS transistor. This structure can reduce the interface trap density and thus enhance the carrier mobility of the channel. The primary surface preferably comprises at least two faces, one of the faces is a (0001) Si-face and the other face intersects the (0001) Si-face at approximately 10 to 16°. The primary surface is a channel face of a field effect MOS transistor. This structure can reduce the interface trap density and thus enhance the carrier mobility of the channel.

Preferably, the area of the face intersecting the (0001) Si-face at 10 to 16° is larger than the area of the (0001) Si-face.

Preferably, the length of the face intersecting the (0001) Si-face at 10 to 16° is 5 nm or more.

Preferably, the channel is designed so that the moving direction of carriers is parallel to the intersection line between the (0001) Si-face and the face intersecting the (0001) Si-face at 10 to 16°. This structure provides smooth carrier movement.

With respect to the face intersecting the (0001) Si-face at 10 to 16°, when the step height is represented by "Hs", the terrace length is represented by "Lt", the length of SiC unit cell in the [11-20] direction is represented by "La", the length of SiC unit cell in the [0001] direction is represented by "Lb" and "n" represents a positive integer, the following equations are satisfied:

$$Lt = 3 \cdot n \cdot La$$

$$Hs = n \cdot Lb$$

and also the following equation is satisfied as the relationship between the step and terrace of one step:

$$Lt:Hs = 3La:Lb$$

It is preferable that the primary surface of the SiC substrate is set so that a diffraction pattern appears in the direction of 10 to 16° from the (0001) Si-face in an RHEED pattern on the surface. More particularly, a field effect MOS transistor formed by using such a substrate should have a diffraction pattern that appears in the direction of 10 to 16° from the (0001) Si-face when the primary surface of the SiC substrate having the step bunching is observed by reflection high energy electron diffraction (RHEED).

It is preferable that the face intersecting to the (0001) Si-face at 10 to 16° is an (11-2a) face, wherein $45 \leq a \leq 74$.

In this specification, when the face of silicon carbide single crystal is represented, it should be originally expressed by affixing a bar "-" at the top side of a required number as shown in the drawings (FIG. 8, etc.). However, in place of affixing a bar at the top side of a required number, the bar "-" is affixed in front of the required number because of restriction imposed on the expression manner in the specification.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
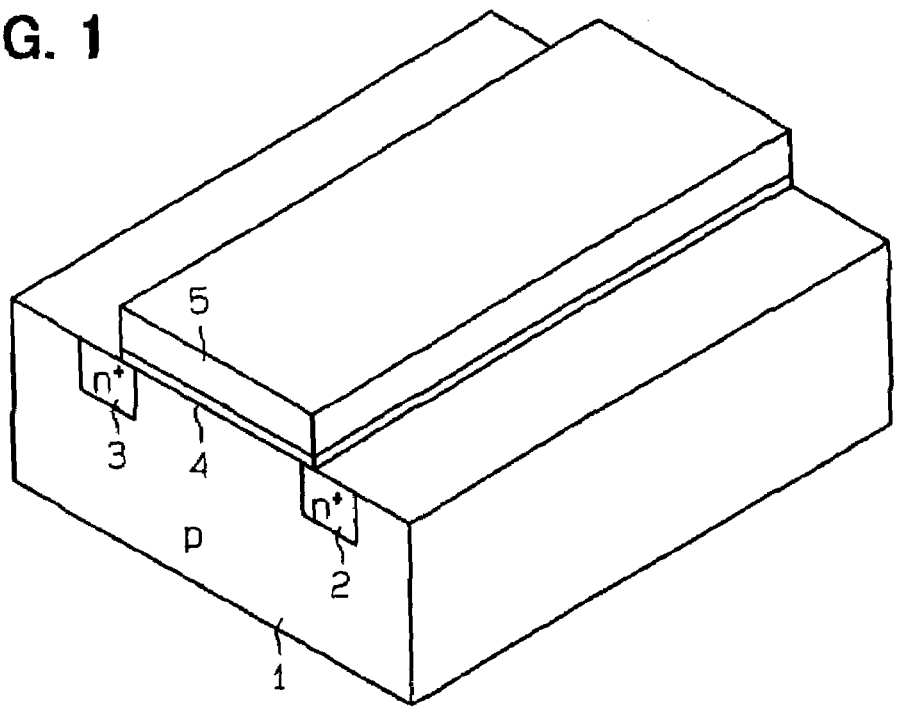
FIG. 1 is a perspective view showing a silicon carbide semiconductor device according to a first preferred embodiment.
Figure 2:
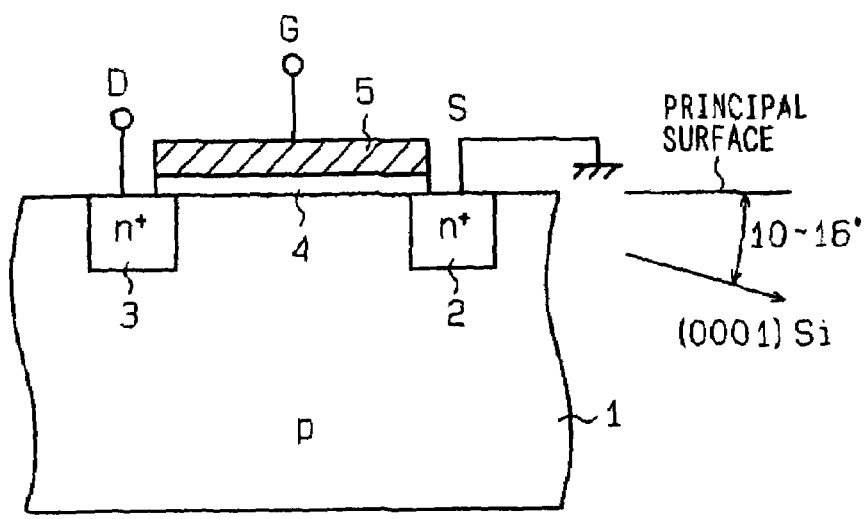
FIG. 2 is a longitudinally-sectional view showing the silicon carbide semiconductor device.

FIG. 1 is a perspective view showing a silicon carbide semiconductor device according to a first preferred embodiment, and FIG. 2 is a longitudinally-sectional view showing the silicon carbide semiconductor device.

A p-type SiC substrate 1 is formed of 4H, 6H, 3C or 15R crystal. The primary surface of the p-type SiC substrate 1 intersects a (0001) Si-face at an angle of 10 to 16°.

An $n^+$ source region 2 and an $n^+$ drain region 3 are formed in the surface layer portion at the primary surface of the p-type SiC substrate 1 so as to be separate from each other. A gate electrode 5 is formed on a gate oxide film (gate insulating film in a broadest sense) 4 on the primary surface of the p-type SiC substrate 1.

As described above, the semiconductor device of this embodiment is an n-channel type planar MOSFET, and further the interface between the gate oxide film 4 and the channel portion is formed of a face intersecting the (0001) Si-face at an angle of 10 to 16°, whereby high carrier mobility is achieved.

Next, a method of manufacturing a silicon carbide semiconductor device (MOSFET) will be described with reference to FIGS. 3A–3C and 4.

Figure 3A:
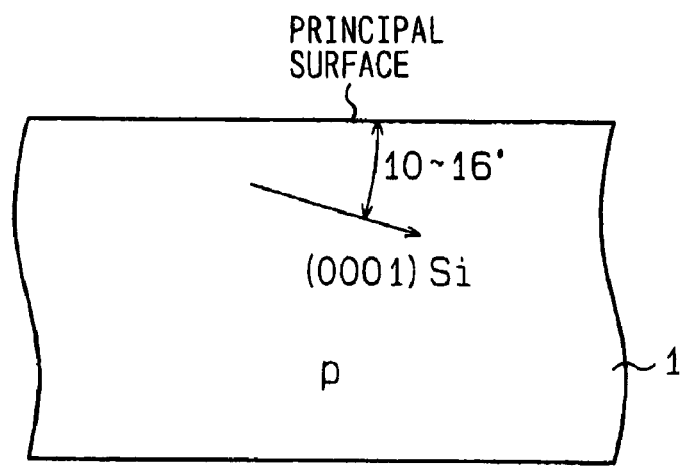
FIGS. 3A–3C are longitudinally-sectional views showing a manufacturing process of the silicon carbide semiconductor device.
Figure 3B:
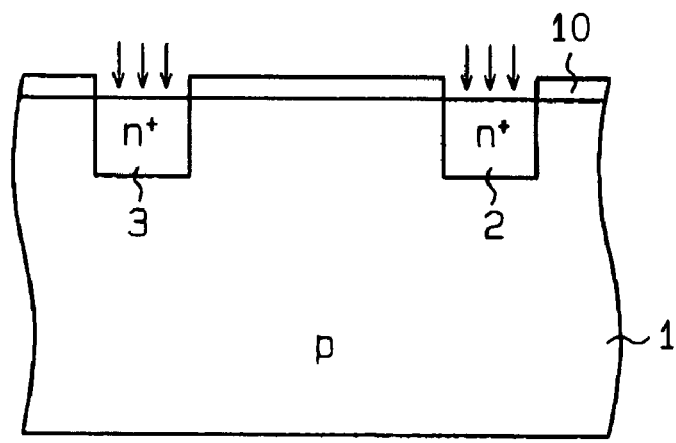

As shown in FIG. 3A, a p-type SiC substrate 1 whose primary surface is a face intersecting the (0001) Si-face at an angle of 10 to 16° is prepared. Specifically, an SiC substrate having an off-angle of 0° or 8° is cut out (polished/ground) to achieve the p-type SiC substrate 1 whose primary surface corresponds to a face intersecting to (0001) Si-face at 10 to 16°. Furthermore, as shown in FIG. 3B, a mask 10 is disposed on the p-type SiC substrate 1, and then the p-type SiC substrate 1 is subjected to ion-implantation of nitrogen to form an $n^+$ source region 2 and an $n^+$ drain region 3.

Figure 3C:
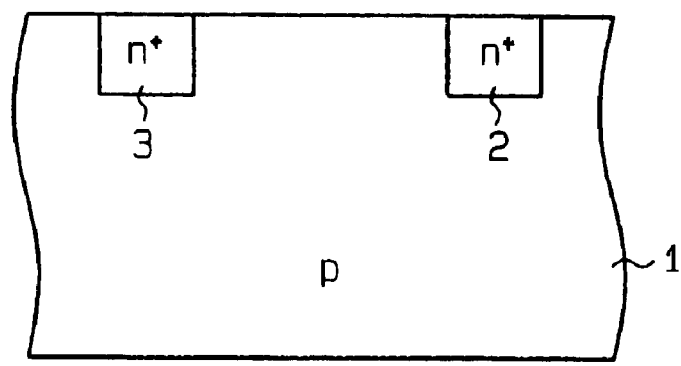
Figure 4A:
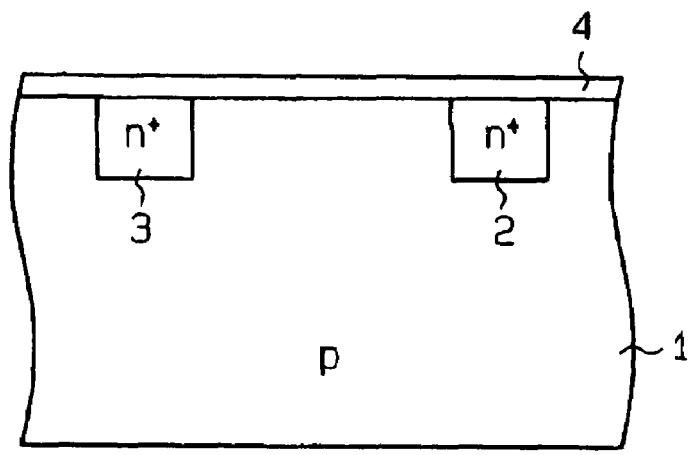
FIGS. 4A–4C are longitudinally-sectional views showing the manufacturing process of the silicon carbide semiconductor device.
Figure 4B:
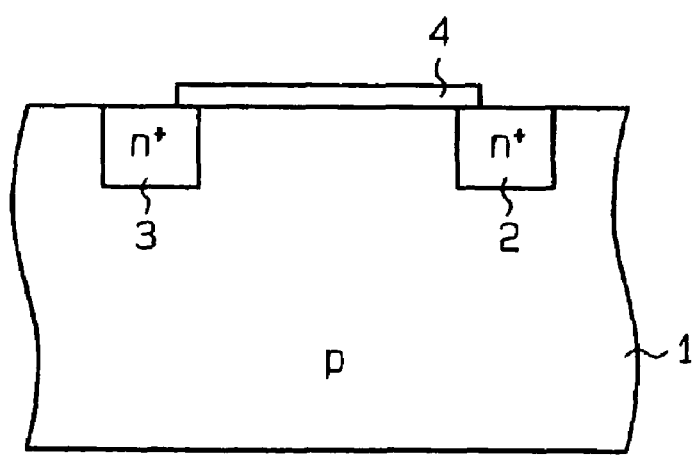
Figure 4C:
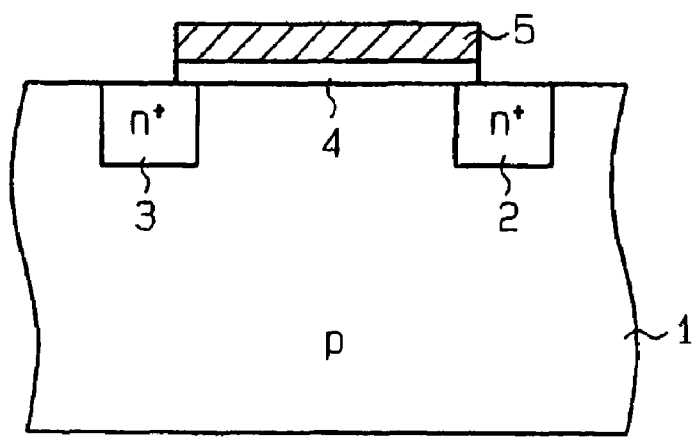

Thereafter, the mask 10 is removed, and gate oxide film 4 is formed on the upper surface of the p-type SiC substrate 1 by thermal oxidation from the state shown in FIG. 3C to the state shown in FIG. 4A. Furthermore, as shown in FIG. 4D, an undesired portion is removed from the gate oxide film 4 by using a masking technique and an etching technique, and then a gate electrode 5 is formed as shown in FIG. 4C.

The silicon carbide semiconductor device (MOSFET) is completed in the manner as described above. In this manufacturing process, the p-type SiC substrate is formed of 4H, 6H, 3C or 15R crystal, and the primary surface thereof corresponds to a face intersecting the (0001) Si-face at 10 to 16°. More particularly, the surface of the substrate before the gate oxidation shown in FIG. 3C is formed corresponds to the face intersecting to the (0001) Si-face at 10 to 16°.

As described above, in this embodiment, the interface between the gate oxide film 4 of the field effect transistor and the channel portion is constructed by the face intersecting the (0001) Si-face at 10 to 16°. This construction can reduce the interface trap density and increase the carrier mobility of the channel as compared with the case where the SiC substrate having the off-angle of 0° or 8° is directly used. As a result, the silicon carbide semiconductor device of this embodiment has excellent practicability with respect to the interface between SiC and the gate insulating film.

Figure 5A:
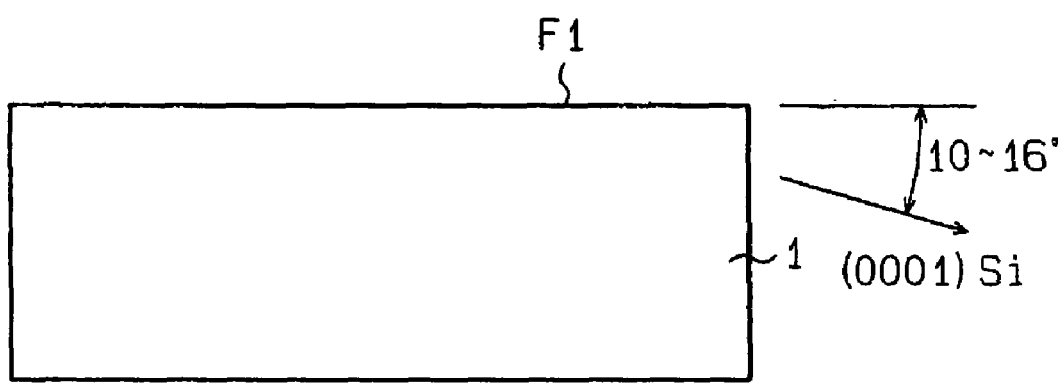
FIGS. 5A–5B are cross-sectional views showing the structure of the surface of the substrate.
Figure 5B:
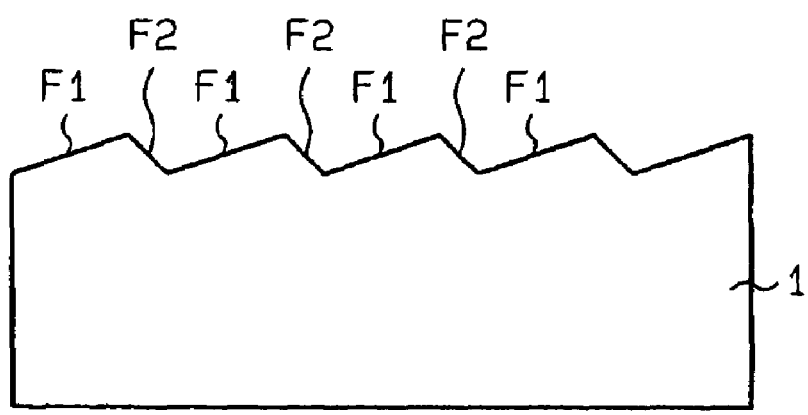

With respect to the SiC substrate 1, the foregoing description is made on an SiC substrate 1 whose primary surface thereof corresponds to a face F1 which intersects to (0001) Si-face at 10 to 16° as shown in FIG. 5A. However, as shown in FIG. 5B, the face F1 intersecting to the (0001) Si-face at 10 to 16° is not the only face on the SiC substrate 1. Another face F2 (for example, (0001) Si-face) also remains. The primary surface may be constructed by these faces F1, F2. Generally, it is merely required that an SiC substrate having as a primary surface a face intersecting at least the (0001) Si-face at 10 to 16° is formed and that the primary surface thereof is a channel face of a field electric MOS transistor. With this construction, the interface trap density can be reduced, and the channel mobility can be enhanced.

Furthermore, the face intersecting to the (0001) Si-face at 10 to 16° is a (11-2a) face, and $45 \leq a \leq 74$.

(Second Embodiment)

Next, a second embodiment will be described.

Figure 6:
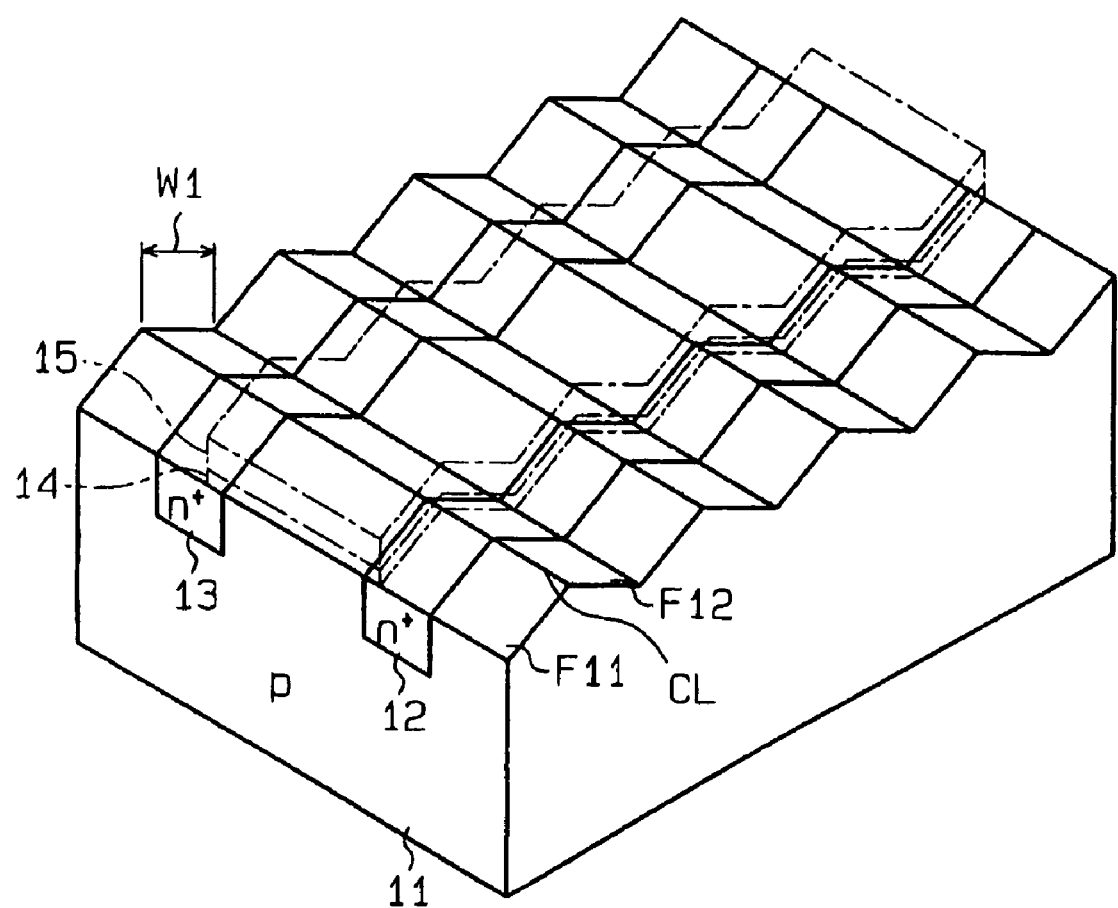
FIG. 6 is a perspective view showing a silicon carbide semiconductor device according to a second preferred embodiment.

FIG. 6 is a perspective view showing a silicon carbide semiconductor device according to this embodiment.

A p-type SiC substrate 11 is formed of 4H, 6H, 3C or 15R crystal. The primary surface of the p-type SiC substrate 11 is formed from two faces, one of which is a (0001) Si-face represented by F11, and the other is a face represented by F12 intersecting the (0001) Si-face at an angle of 10 to 16°. This surface is achieved through step bunching by heating under an ultra-high vacuum.

An $n^+$ source region 12 and an $n^+$ drain region 13 are formed in the surface layer portion at the primary surface of the p-type SiC substrate 11 so as to be separated from each other. A gate electrode 15 is formed on a gate oxide film (gate insulating film in a broadest sense) 14 on the primary surface of the p-type SiC substrate 11.

As the channel structure, the moving direction of carriers is set to be parallel to the cross line CL between the (0001) Si-face and the face intersecting the (0001) Si-face at 10 to 16°, whereby the moving direction of the carriers and the bunching steps can be made parallel to each other.

The manufacturing process of the second embodiment is substantially identical to that of the first embodiment, however, it is different from the first embodiment in that the surface before the gate oxide film is formed comprises two faces. More particularly, the surface comprises the (0001) Si-face and the face intersecting the (0001) Si-face at an angle of 10 to 16°.

Such a face is achieved by, for example, heating the (0001) Si-face under ultra-high vacuum. More particularly, in the first embodiment, a substrate whose primary surface is the face intersecting the (0001) Si-face at 10 to 16° is used. However, according to the second embodiment, any SiC substrate whose face has any inclination to the (0001)

Si-face is first used. Specifically, a substrate having an off-angle of 8° may be used. This substrate is subjected to a heat treatment to form step bunching at a site serving as a surface channel layer (i.e., on the surface), thereby achieving a face intersecting to the (0001) Si-face at 10 to 16°.

A method of forming the step bunching at the site serving as the surface channel layer (the surface) will be described in detail below.

Figure 7A:
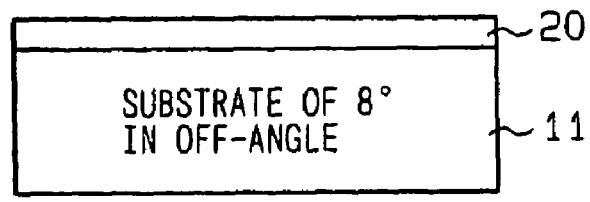
FIGS. 7A–7D are longitudinally-sectional views showing a manufacturing process.
Figure 7B:

As shown in FIG. 7A, an SiC substrate 11 whose primary surface has any inclination to the (0001) Si-face (i.e., the primary surface of the SiC substrate intersects the (0001) Si-face at any angle). Preferably, the SiC substrate 11 has an off-angle of 8°. Thereafter, $SIO_2$ deposition film 20 is formed on the surface of the substrate 11. The $SIO_2$ film 20 is removed as shown in FIG. 7B. Thereafter, the surface of the SiC substrate 11 is washed.

Figure 7C:
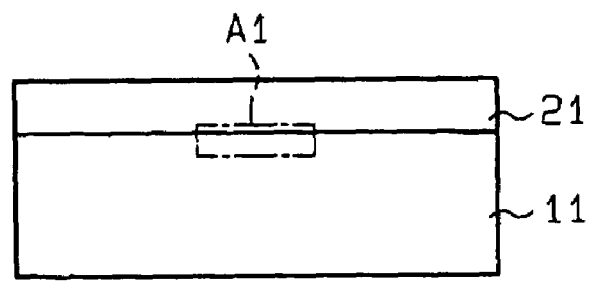
Figure 7D:
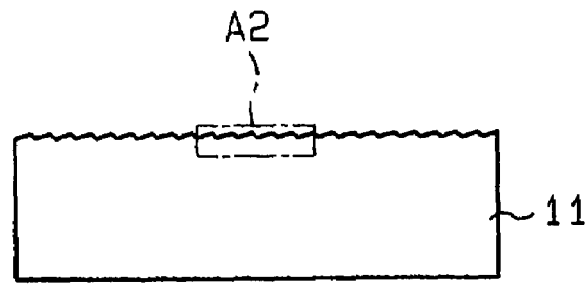

Furthermore, as shown in FIG. 7C, an Si layer 21 of about 5 m in thickness is formed on the surface of the SiC substrate 11 by deposition or the like. Subsequently, the inside of an ultra-high vacuum chamber is heated to keep the SiC substrate 11 at a fixed temperature range of 500 to 1100° C. (increasing the temperature of the SiC substrate). At this time, it is preferable to increase the temperature to 1050° C. By increasing the temperature as described above, step bunching is formed on the surface of the substrate as shown in FIG. 7D.

Figure 8:
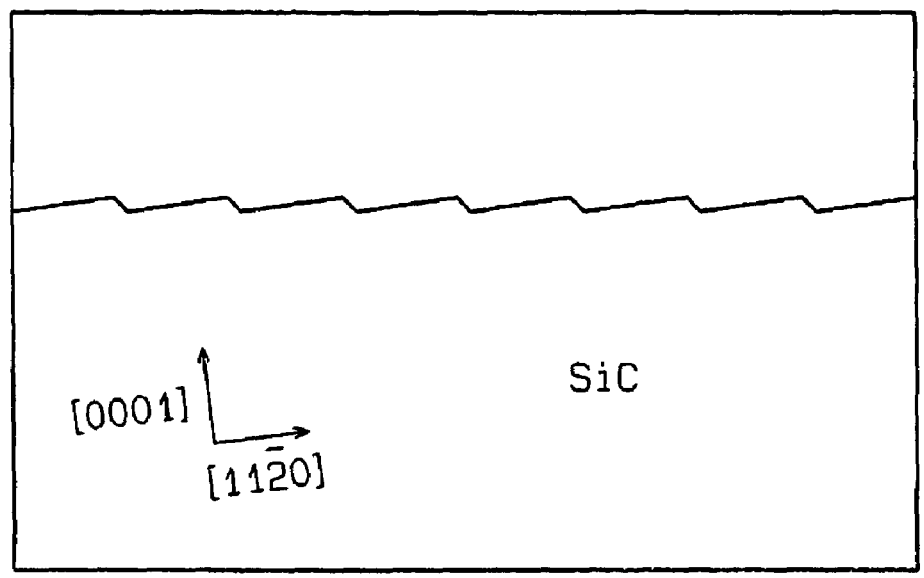
FIG. 8 is a cross-sectional view showing the structure of the substrate surface.
Figure 9:
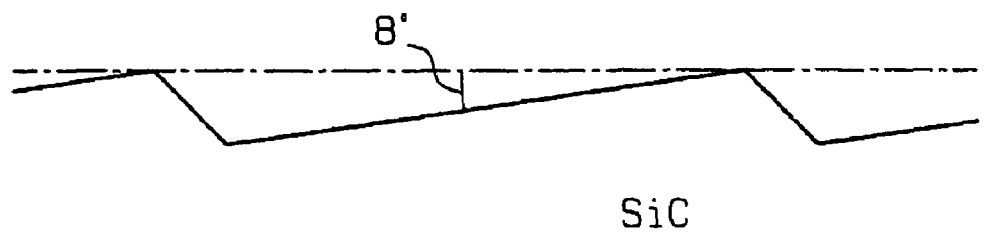
FIG. 9 is a cross-sectional view showing the structure of the substrate surface.
Figure 10:
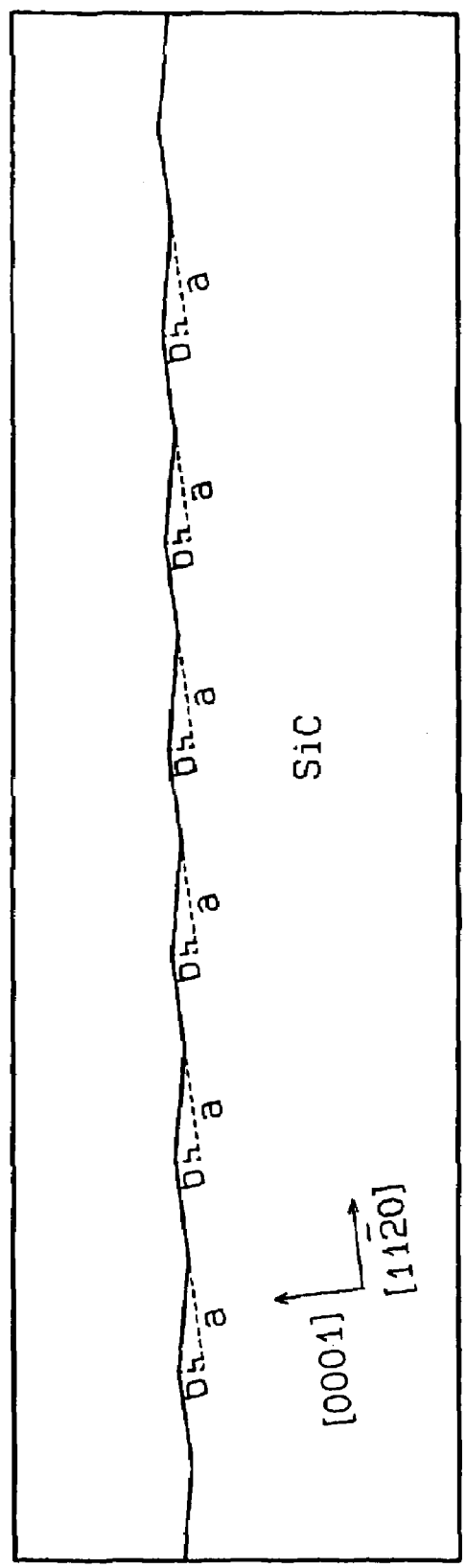
FIG. 10 is a cross-sectional view showing the structure of the substrate surface.
Figure 11:
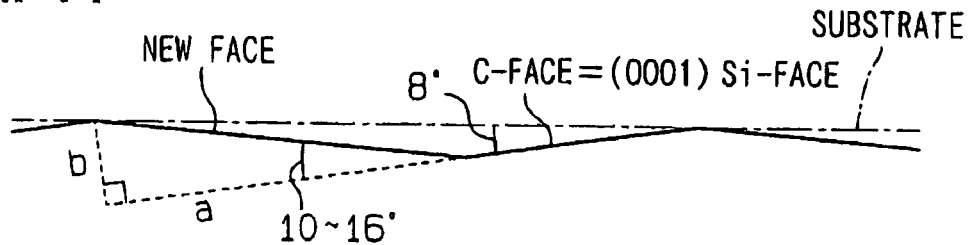
FIG. 11 is a cross-sectional view showing the structure of the substrate surface.

Specifically, as shown in FIG. 8, which is an enlarged view of the substrate surface (a site represented by A1) of FIG. 7C, the substrate having an off-angle of 8° has a surface structure as shown in FIG. 9. By increasing the temperature from this state, the step bunching is formed as shown in FIG. 10, which is an enlarged view of the substrate surface (a site represented by A2) of FIG. 7D, and thus the surface structure as shown in FIG. 11 is achieved. Accordingly, a c-face, more particularly, step bunching satisfying $\tan^{-1}(b/a)=10$ to 16° with respect to the (0001) Si-face is formed. More particularly, the new face of the bunching is inclined to the c-face at 10 to 16°.

Figure 12A:
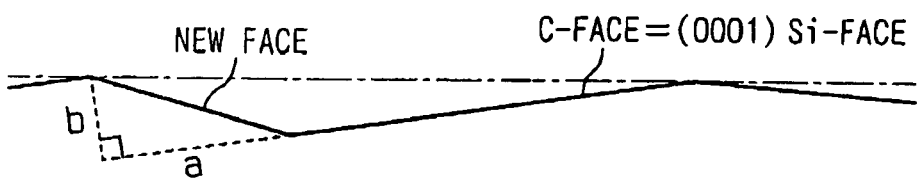
FIGS. 12A–12B are cross-sectional views showing the structure of the substrate surface.
Figure 12B:
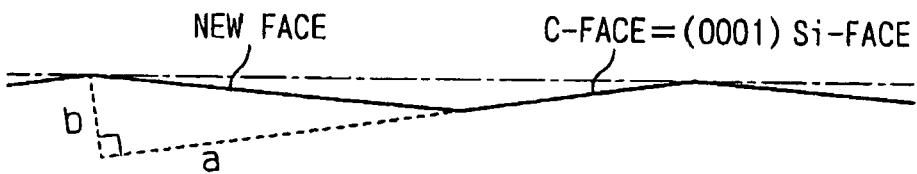

In this case, the area of the (0001) Si-face and the area of the face intersecting to the (0001) Si-face at 10 to 16° are set as follows. Preferably, the area of the face intersecting the (0001) Si-face at 10 to 16° is larger than the area of the (0001) Si-face as shown in FIG. 12B as compared with the case where the area of the face intersecting to the (0001) Si-face at 10 to 16° is smaller than the area of the (0001) Si-face as shown in FIG. 12A. Preferably, the area of the (0001) Si-face represented by F11 is smaller than the area of the face intersecting to the (0001) Si-face represented by F12 in FIG. 6.

Figure 13A:
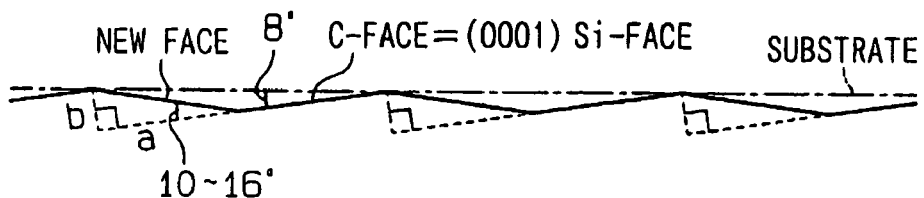
FIGS. 13A–13B are cross-sectional views showing the structure of the substrate surface.
Figure 13B:
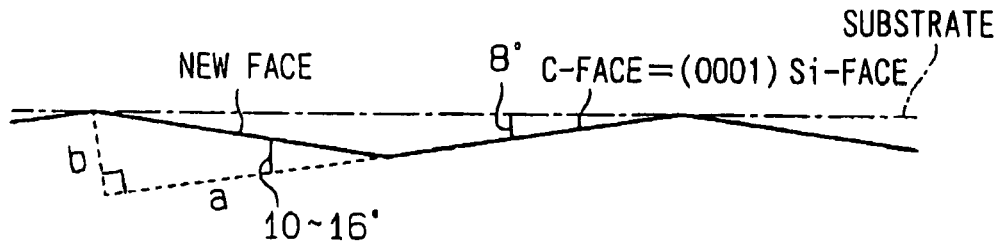

The carriers are liable to be dispersed by unevenness of the channel face. Therefore, it is preferable that the number of uneven portions per unit length is smaller as shown in FIG. 13B as compared with the case where it is larger as shown in FIG. 13A. Specifically, in FIG. 6, it is more preferable that the width W1 of the face intersecting to the (0001) Si-face at 10 to 16° is set to 5 nm or more.

The Si layer 21 is formed on the substrate surface before increase of the temperature as shown in FIG. 7C. If the temperature was increased before formation of the Si layer 21, the substrate surface would be subjected to Carbon even if the temperature was increased under an ultra-high vacuum. In addition to a method of forming Si on the surface, vapor pressure of Si in the neighborhood of the surface of a sample is increased by Si flux or the like.

The MOS structure of this embodiment can be achieved by using the SiC substrate 11 and applying the manufacturing process described above with reference to FIGS. 3 and 4.

The increasing of the temperature in the ultra-high vacuum chamber may be carried out such that the step bunching of 10 to 16° is formed while temperature steps of two or more are combined, thereby controlling a face-formation rate. For example, the temperatures may be set to 1050° C. and 950°.

Figure 14:
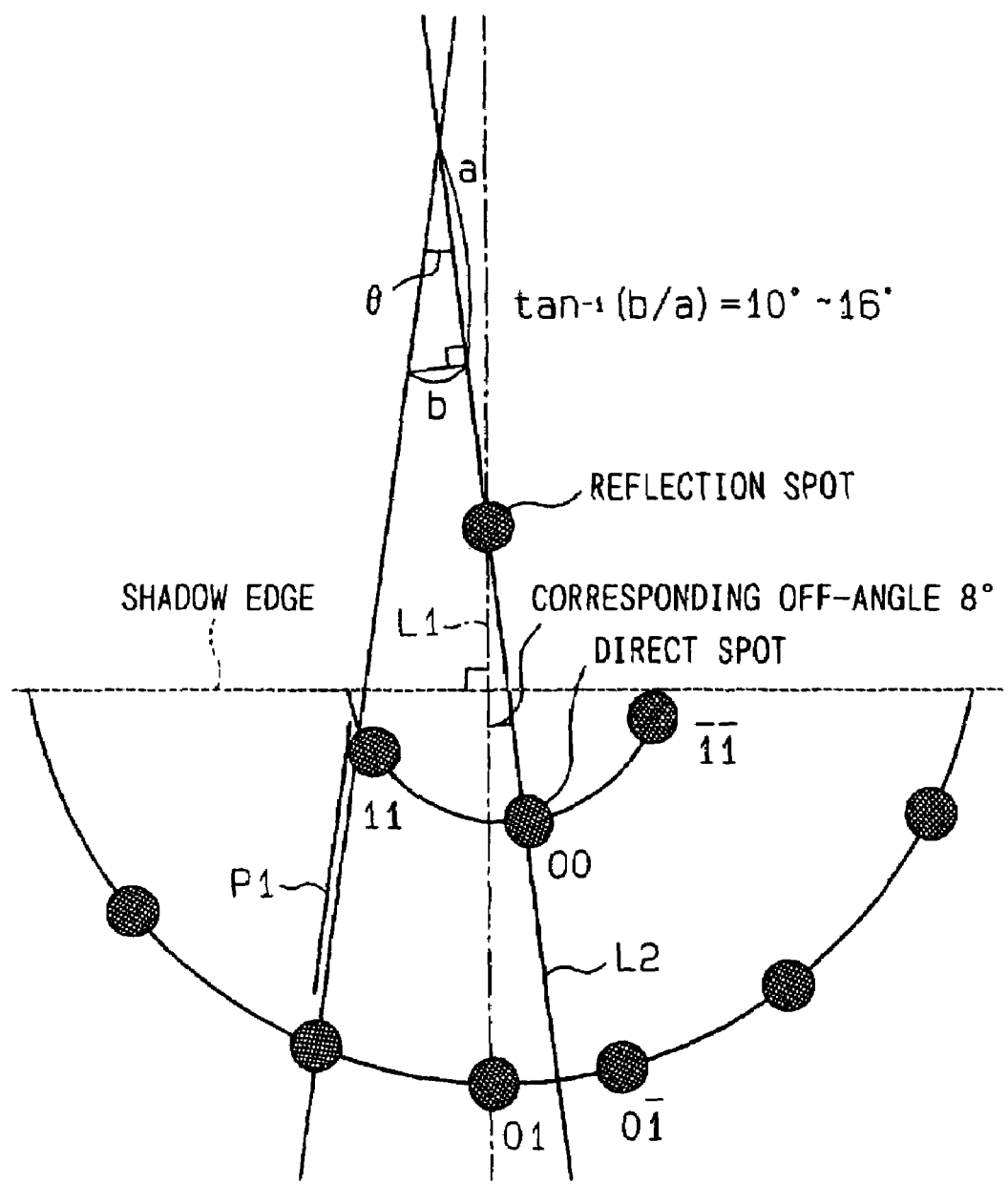
FIG. 14 shows an observation diagram of the substrate surface by reflection high energy electron diffraction (RHEED)

FIG. 14 is an observation diagram of reflection high energy electron diffraction (RHEED) to the surface of the SiC substrate having an off-angle of 8°, the surface having the step bunching comprising the (0001) Si-face and the face intersecting to the (0001) Si-face at 10 to 16°.

The black dots in FIG. 14 represent spots caused by primitive lattice reflection of SiC. In the case of an SiC substrate which has no off-angle and whose primary surface is (0001) Si-face, the spots caused by the SiC primitive lattice reflection are symmetrical with respect to the vertical line L1 to the shadow edge which passes a reflection spot. In the figure of FIG. 14, a straight line L2 connecting the reflection spot and the direct spot (00) is displaced from the vertical line L1 by about 8°. This means that the substrate having an off-angle of 8° is used. At this time, a diffraction pattern P1 appears. The diffraction pattern P1 is linear and extends in the direction inclined to the straight line L2 by 10 to 16°. The appearance of the diffraction pattern P1 means that there is a face intersecting the (0001) Si-face at 10 to 16°. In some cases, the diffraction pattern P1 appears in the form of "dots". When the face intersecting the (0001) Si-face at 10 to 16° is formed of plural steps (narrow terraces), it appears in the form of a streak (straight line).

As described above, with respect to the primary surface of the SiC substrate, the diffraction pattern P1 appears in the direction inclined to the (0001) Si-face by 10 to 16° in the RHEED pattern of the surface. It is preferable to form a field effect MOS transistor by using a substrate for which the diffraction pattern P1 appears in the direction inclined to the (0001) Si-face by 10 to 16° when the primary surface of the SiC substrate having the step bunching is observed by the reflection high energy electrode diffraction (RHEED).

The diffraction pattern appearing in the direction inclined to the (0001) Si-face by 10 to 16° may be confirmed by using X-ray diffraction. More particularly, the primary surface of the SiC substrate is defined such that a diffraction pattern appears in the direction inclined to the (0001) Si-face by 10 to 16° in the RHEED pattern or X-ray diffraction pattern of the surface.

Figure 15:
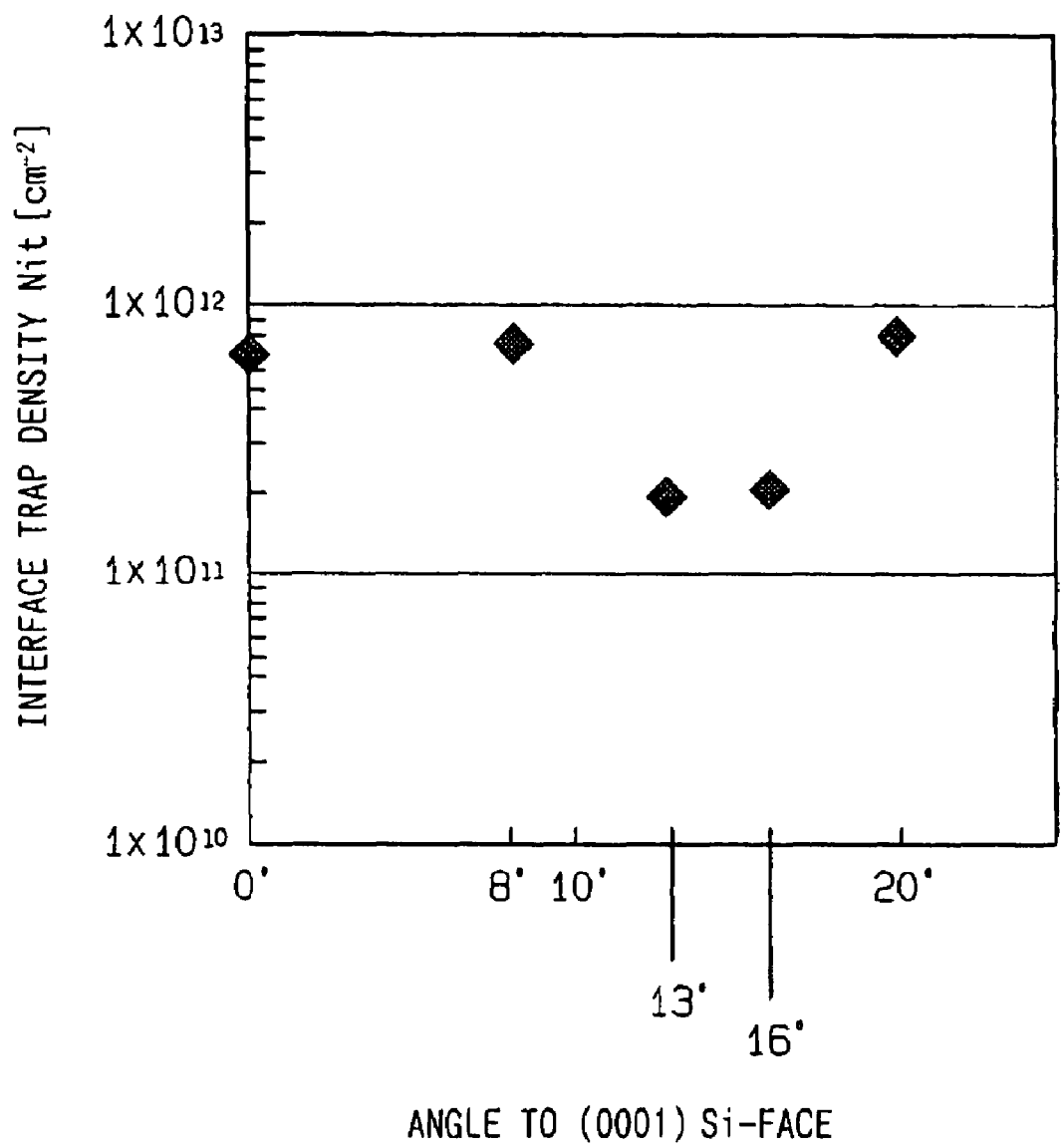
FIG. 15 is a diagram showing a measurement result of the relationship between the interface trap density and the angle to (0001) Si-face.

FIG. 15 shows a measurement result of the relationship between the interface trap density and the angle to the (0001) Si-face.

The interface trap density Nit of FIG. 15 is determined as follows. An SiC substrate having two faces, one of which is a (0001) Si-face and the other face inclined to the (0001) Si-face by some angle, and an MOS diode formed on the substrate to estimate the interface trap density is used. Here, the interface trap density Nit means an interface trap density per unit area, and it is an index for interface quality achieved by integrating Dit (the interface trap density per unit area and unit energy) with respect to energy. From FIG. 15, it is apparent that the interface trap density Nit would be set to the lowest value if the inclination (intersecting) angle to the (0001) Si-face ranges from 13 to 16°.

Figure 16:
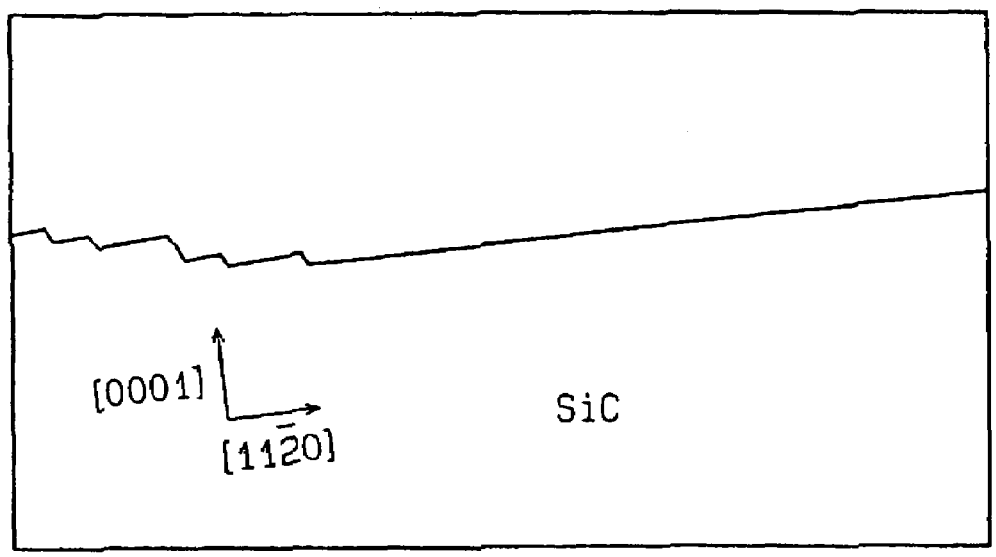
FIG. 16 is a cross-sectional view showing the structure of the substrate surface.
Figure 17:
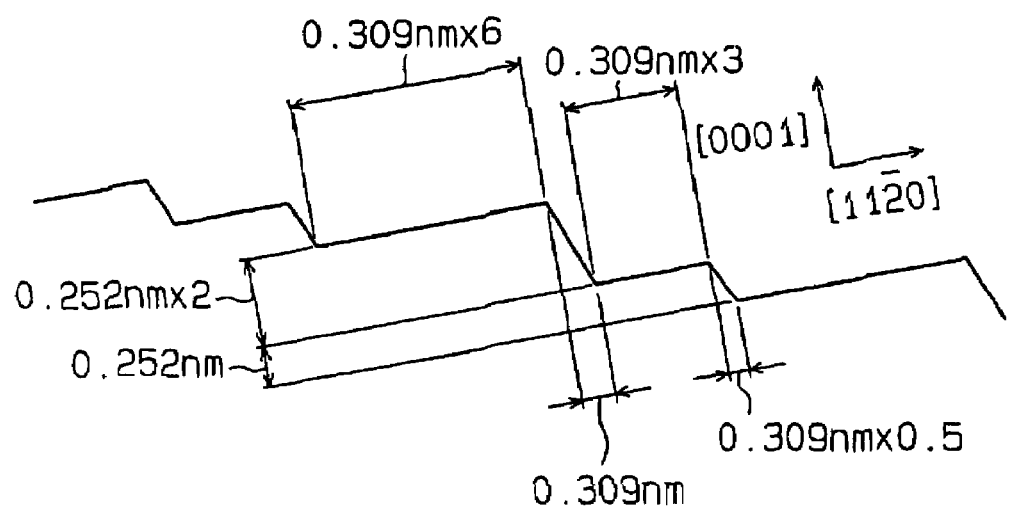
FIG. 17 is a cross-sectional view showing the structure of the substrate surface.

In the surface structure of the SiC substrate shown in FIG. 16, it is preferable that the step height and terrace length of the face intersecting the (0001) Si-face at 13 to 16° is set as follows as shown in FIG. 17. The step height is set to an integer value multiplied by the length (=0.252 nm) of an SiC unit cell in the [0001] direction, the terrace length is set to an integer value multiplied by three times the length (=0.309 nm) of the SiC unit cell in the [11-20] direction, and the terrace length and the step height are set in a fixed ratio. More specifically, in FIG. 17, the step height is set to 0.252 nm and the terrace length may be set to 0.309 nm×3, or the step height may be set to 0.252 nm×2 and the terrace length is set to 0.309 nm×6. When the step height is represented by Hs, the terrace length is represented by Lt, the length of SiC unit cell in [11-20] direction is represented by La, the length of SiC unit cell in [0001] direction is represented by Lb and a positive integer is represented by n, the following equations are satisfied on the face intersecting to the (0001) Si-face at 13 to 16°.

$$Lt = 3 \cdot n \cdot La$$

$$Hs = n \cdot Lb$$

In the relationship between the step and the terrace of one step, Lt:Hs=3·La:Lb The face intersecting to the (0001) Si-face at 10 to 16° means (11-2a) faces, and $45 \leq a \leq 74$.

As described above, in the silicon carbide semiconductor device according to this embodiment, the SiC substrate having the primary surface comprising at least two faces, the (0001) Si face and the face intersecting to the (0001) Si-face at 10 to 16° is formed, and the primary surface of the SiC substrate corresponds to the channel face of the field effect MOS transistor. In general, carriers are dispersed by unevenness of the channel face, and thus the mobility thereof is restricted. However, when the surface of the substrate before formation of the gate oxide film on the surface is formed of two faces, More particularly, the (0001) Si-face and the face intersecting to the (0001) Si-face at 10 to 16° like this embodiment, the mobility can be remarkably enhanced as compared with the case where an SiC substrate having an off-angle of 0° or 8° is directly used. As described above, the mobility of carriers in the channel can be enhanced by reducing the interface trap density. As a result, the semiconductor device manufactured according to this embodiment has excellent practicability with respect to the interface between SiC and the gate insulating film, particularly when the face intersecting to the (0001) Si-face at 13 to 16° is used.

Furthermore, in the channel structure, the moving direction of the carriers is parallel to the cross line CL between the (0001) Si-face and the face intersecting to the (0001) Si-face at 10 to 16° as shown in FIG. 6, so that the carrier moving direction and the bunching steps can be arranged in parallel. Therefore, the carriers can move more smoothly.

More particularly, the channel is designed so that the vertical direction to the off-direction of the substrate which indicates the direction of inclining the crystal axis of the SiC substrate becomes the carrier moving direction, whereby the steps of the step bunching formed in the direction perpendicular to the off-direction are parallel to the carrier moving direction of the channel. Therefore, the moving direction of the carriers in the channel of the field effect transistor does not cross the bunching steps, so that the carrier mobility can be more enhanced and the resistance of the overall channel can be reduced.

(Third Embodiment)

Next, the difference of a third embodiment from the first and second embodiments will be mainly described.

Figure 18:
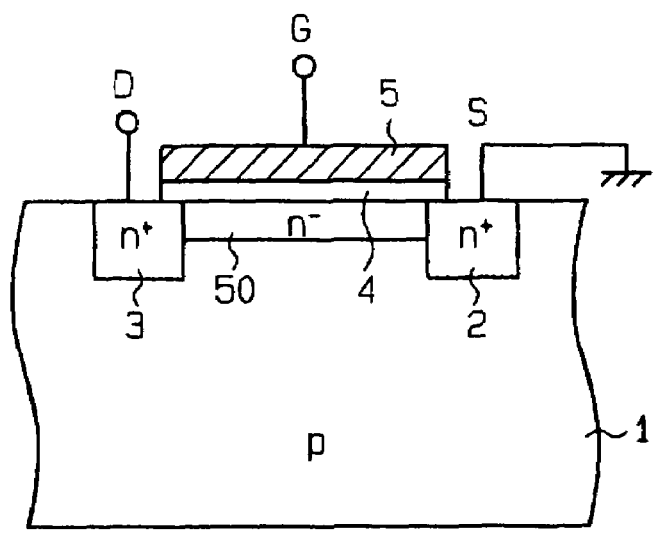
FIG. 18 is across-sectional view showing a silicon carbide semiconductor device according to a third preferred embodiment.

FIG. 18 is a longitudinally-sectional view showing a silicon carbide semiconductor device according to the third embodiment. The semiconductor device of this embodiment is an accumulation type MOS transistor having a low concentration layer 50 in a channel region as compared with the inversion type MOS transistor of FIG. 2.

This semiconductor device can be manufactured by a general MOS manufacturing process although the manufacturing method is not illustrated. As in the case of the first embodiment, the semiconductor device is designed so that the interface between the gate oxide film 4 and the channel portion is formed of the face intersecting to the (0001) Si-face at 10 to 16°. Alternatively, it may be designed so that the surface of the substrate before the formation of the gate oxide film 4 is formed of two faces, which are the (0001) Si-face and the face intersecting to the (0001) Si-face at 10 to 16° as in the second embodiment.

(Fourth Embodiment)

Next, the difference of a fourth embodiment from the first and second embodiments will be described.

Figure 19:
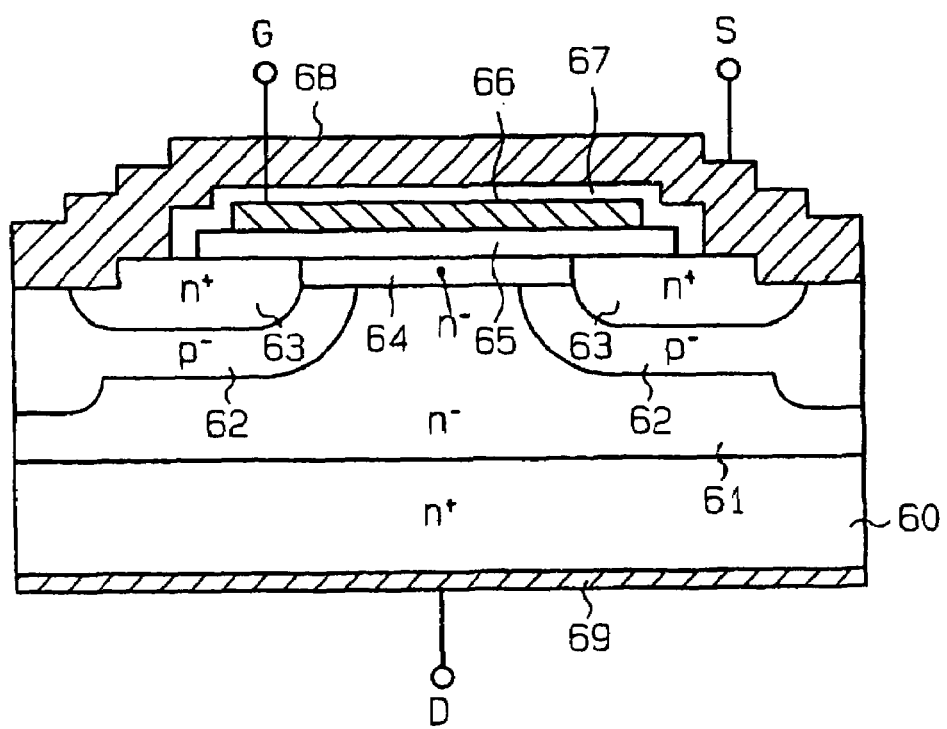
FIG. 19 is a cross-sectional view showing a silicon carbide semiconductor device according to a fourth preferred embodiment.

FIG. 19 is a longitudinally-sectional view showing a silicon carbide semiconductor device according to the fourth embodiment. The semiconductor device of this embodiment is a vertical MOS. Specifically, an n⁻ region 61 is formed on an n⁺ SiC substrate 60 by epitaxial growth. A p⁻ region 62 is formed at the surface portion on the primary surface (the upper surface of the n⁻ region 61) of the substrate, an n⁺ source region 63 is formed in the surface layer portion of the p⁻ region 62, and a low-concentration layer 64 is formed in the channel region of the surface layer portion of the n⁻ region 61. A gate electrode 66 is formed on a gate oxide film (gate insulating film in a broad sense) on the low-concentration layer 64. A source electrode 68 is formed on an insulating film 67 on the gate electrode 66, and the source electrode 68 comes into contact with the n⁺ source region 63 and the p⁻ region 62. A drain electrode 69 is formed on the lower surface (back surface) of the n⁺ SiC substrate 60.

As in the case of the first embodiment, the semiconductor device is designed so that the interface between the gate oxide film 65 and the channel portion is formed of a face intersecting the (0001) Si-face at 10 to 16°. Alternatively, it may be designed so that the surface of the substrate before formation of the gate oxide film 65 is formed of two faces, which are the (0001) Si-face and the face intersecting to the (0001) Si-face at 10 to 16° like the second embodiment.

In the above embodiments the face intersecting to the (0001) Si-face at 10 to 16° is measured by using the method of analyzing a diffraction pattern achieved by RHEED. However, the present invention is not limited to this method. For example, a method of measuring the face intersecting the (0001) Si-face at 10 to 16° may be based on a sectional TEM (transmission electron microscope) micrograph, a profile of AFM (atomic force microscope) or the like.

The description of the invention is merely exemplary in nature and, thus, variations that do not depart from the gist of the invention are intended to be within the scope of the invention. Such variations are not to be regarded as a departure from the spirit and scope of the invention.

The invention claimed is:

1. A silicon carbide semiconductor device comprising:
   an SiC substrate having as a primary surface a face intersecting to at least (0001) Si-face at an angle of 10 to 16°, wherein the primary surface is a channel face of a field effect MOS transistor.

2. A silicon carbide semiconductor device comprising:
   an SiC substrate having a primary surface including at least a (0001) Si-face and a face intersecting the (0001) Si-face at approximately 10 to 16°, wherein the primary surface is a channel face of a field effect MOS transistor.

3. The silicon carbide semiconductor device according to claim 2, wherein the area of the face intersecting the (0001) Si-face at 10 to 16° is greater than the area of the (0001) Si-face.

4. The silicon carbide semiconductor device according to claim 2, wherein the length of the face intersecting the (0001) Si-face at 10 to 16° is approximately 5 nm or greater.

5. The silicon carbide semiconductor device according to claim 2, wherein the channel face is set so that the moving direction of carriers is parallel to an intersection between the (0001) Si-face and the face intersecting the (0001) Si-face at approximately 10 to 16°.

6. The silicon carbide semiconductor device according to claim 2, wherein when a step height of the face intersecting the (0001) Si-face at 10 to 16° is represented by "Hs", a terrace length the face intersecting to the (0001) Si-face at 10 to 16° is represented by "Lt", a length of SiC unit cell in the direction is represented by "La", a length of SiC unit cell in the direction is represented by "Lb" and "n" represents a positive integer, the following equations are satisfied on the face intersecting to the (0001) Si-face at 13 to 16°:

$$Lt = 3 \cdot n \cdot La$$

$$Hs = n \cdot Lb$$

and also the following equation is satisfied as a relationship between the step height and terrace length of one step:

$$Lt:Hs = 3La:Lb.$$

7. The silicon carbide semiconductor device according to claim 2, wherein the primary surface of the SiC substrate is set so that a diffraction pattern appears in the direction of 10 to 16° from the (0001) Si-face in an RHEED pattern on the surface.

8. The silicon carbide semiconductor device according to claim 2, wherein the face intersecting the (0001) Si-face at approximately 10 to 16° is an (11-2a) face, wherein $45 \leq a \leq 74$.

9. The silicon carbide semiconductor device of claim 2, wherein a step height of the face intersecting to the (0001) Si-face at 10 to 16° is proportional to a length of an SiC unit cell in a direction by a first integer value, wherein a terrace length of the face intersecting to the (0001) Si-face at 10 to 16° is proportional to a length of the SiC unit cell in a direction by second integer value.

10. The silicon carbide semiconductor device of claim 9, wherein a ratio of the step height to the terrace length is approximately proportional to another ratio between the length of the SiC unit cell in the direction and the length of SiC unit cell in direction.

11. The silicon carbide semiconductor device according to claim 1, wherein the primary surface of the SiC substrate is set so that a diffraction pattern appears in the direction of 10 to 16° from the (0001) Si-face in an RHEED pattern on the surface.

12. The silicon carbide semiconductor device according to claim 1, wherein the face intersecting the (0001) Si-face at approximately 10 to 16° is an (11-2a) face, wherein $45 \leq a \leq 74$.

* * * * *